(12) United States Patent
Quarantello

(10) Patent No.: US 6,892,472 B2
(45) Date of Patent: May 17, 2005

(54) METHOD AND APPARATUS FOR CLEANING AND DRYING A WORKPIECE

(75) Inventor: Justin M. Quarantello, Phoenix, AZ (US)

(73) Assignee: Novellus Systems, Inc., Chandler, AZ (US)

(*) Notice: Subject to any disclaimer, the term of this patent is extended or adjusted under 35 U.S.C. 154(b) by 0 days.

(21) Appl. No.: 10/391,856

(22) Filed: Mar. 18, 2003

(65) Prior Publication Data

US 2004/0181965 A1 Sep. 23, 2004

(51) Int. Cl.⁷ .................................................. F26B 5/08
(52) U.S. Cl. ........................ 34/317; 34/58; 34/560; 134/902
(58) Field of Search ........................... 134/902; 34/317, 34/357, 447, 482, 498, 560, 58

(56) References Cited

U.S. PATENT DOCUMENTS

| | | | |
|---|---|---|---|
| 4,326,553 A | 4/1982 | Hall | |
| 4,651,440 A | 3/1987 | Karl | |
| 4,980,300 A | 12/1990 | Miyashita et al. | |
| 5,099,614 A | 3/1992 | Arai et al. | |
| 5,329,732 A | 7/1994 | Karlsrud et al. | |
| 5,498,199 A | 3/1996 | Karlsrud et al. | |
| 5,500,081 A * | 3/1996 | Bergman ..................... | 438/706 |
| 5,558,110 A | 9/1996 | Williford, Jr. | |
| 5,562,778 A | 10/1996 | Koretsky et al. | |
| 5,778,554 A * | 7/1998 | Jones ........................... | 34/58 |
| 5,829,156 A | 11/1998 | Shibasaki et al. | |
| 6,077,412 A * | 6/2000 | Ting et al. .................. | 205/143 |
| 6,327,793 B1 * | 12/2001 | Gurer et al. ................. | 34/317 |
| 6,334,902 B1 | 1/2002 | Mertens et al. | |
| 6,398,975 B1 | 6/2002 | Mertens et al. | |
| 6,491,764 B2 * | 12/2002 | Mertens et al. ............. | 134/36 |
| 2002/0121286 A1 | 9/2002 | Verhaverbeke et al. | |
| 2002/0121290 A1 | 9/2002 | Tang et al. | |

* cited by examiner

Primary Examiner—Denise L. Esquivel
Assistant Examiner—Kathryn S. O'Malley
(74) Attorney, Agent, or Firm—Ingrassia Fisher & Lorenz PC

(57) ABSTRACT

A method and apparatus for rinsing and spin-drying a hydrophobic material such as a hydrophobic semiconductor wafer improves wafer drying while at the same time reduces the formation of residual contaminants on the dried surface of the wafer. This is accomplished by first establishing a safe-zone between a minimum rotational speed above which drying proceeds satisfactorily and a maximum rotational speed above which contaminants dry on the wafer's surface. A spin-rate profile can then be adopted such that the rinse/dry process proceeds within the safe zone.

28 Claims, 7 Drawing Sheets

METHOD AND APPARATUS FOR CLEANING AND DRYING A WORKPIECE

TECHNICAL FIELD

This invention relates generally to an apparatus and method for cleaning and drying a workpiece such as a semiconductor wafer, and more particularly, to an apparatus and method for cleaning and spin-drying semiconductor wafers having hydrophobic surfaces.

BACKGROUND OF THE INVENTION

Chemical mechanical polishing (CMP) is a technique which has been conventionally used for the planarization of semiconductor wafers. For example, see U.S. Pat. No. 5,099,614, issued in March in 1992 to Riarai et al; U.S. Pat. No. 5,329,732 issued July 1994 to Karlsrud et al, and U.S. Pat. No. 5,498,199 issued March 1966 to Karlsrud et al. Furthermore, chemical mechanical polishing is often used in the formation of microelectronic devices to provide a substantially smooth, planar surface suitable for subsequent fabrication processes such as a photoresist coating and pattern definition. A typical chemical mechanical polishing apparatus suitable for planarizing a semiconductor surface generally includes a wafer carrier configured to support, guide, and apply pressure to a wafer during the polishing process, a polishing compound such as a slurry to assist in removal of material from the surface of the wafer, and a polishing surface such as a polishing pad.

A wafer surface is generally polished by moving the surface of the wafer to be polished relative to the polishing surface in the presence of a polishing compound. In particular, the wafer is placed in a carrier such that the surface to be polished is placed in contact with the polishing surface, and the polishing surface and the wafer are moved relative to each other while slurry is supplied to the polishing surface.

Semiconductor wafers used in the manufacture of integrated circuit are subjected to a plurality of fabrication steps. These steps may involve the growth or deposition of insulating layers, the deposition of metal or other conductive layers, impurity doping, photolithographic patterning and the like. These steps are often preceded or followed by cleaning steps which involve, for example, scrubbing, spray cleaning, musing and the like. At the completion of the cleaning step, the wafer is further processed to remove water or cleaning agents so as to prevent the water and/or cleaning agent from drying and leaving a contaminating residue on the wafer surface. In the current state of the art, the last step in a cleaning procedure usually comprises a rinsing step utilizing ultra-pure (deionized) water followed by a drying step.

Spin drying is a process commonly used to remove liquid residue from the surface of a wafer. In such a process, the wafer is spun about its axis at a high rotational velocity such that centrifugal force drives the liquid radially outward and off the edge of the wafer. Spin drying is accomplished by placing the wafer in a spin rinse drier (SRD) comprising a platform that is coupled to a drive motor. The drive motor causes the platform to spin at a velocity of, for example, 1000–4000 rpm. In the past, such wafers were comprised, in part, of a metal (e.g. copper) and a hydrophilic oxide (e.g. TEOS as the inner layer dielectric (ILD) oxide). Water wets a hydrophilic surface; i.e. a thin layer of water spreads relatively evenly over the wafer surface and flows off the edge of the wafer upon the application of centrifugal force as described above. As the wafer dries, only a small amount of residue is left on the wafer surface. Due to the need for faster integrated circuitry, however, there has been increased use of low dielectric constant (K) dielectrics such as carbon doped oxides and spin-on materials (e.g. polyimide) which exhibit hydrophobic characteristics; i.e. they repel water. Water beads on hydrophobic surfaces, and as the hydrophobic nature of a material increases, the contact angle of a bead of water on the surface increases. This beading phenomenon results in greater amounts of water residing on smaller defined areas of the wafer surface. While drying (i.e. spinning in an SRD), the resulting centrifugal force on each bead of water causes each bead to roll toward the edge of the wafer. Unfortunately, as the bead rolls toward the edge of the wafer, it leaves droplets of water behind that dry leaving contaminants on the surface. These contaminants appear as radial lines or streaks corresponding to the trail of droplets left by the bead as it rolled toward the wafer's edge. The amount of contaminant left on the hydrophobic surface exceeds that left on a hydrophilic surface because of the beading and because the failure to "wet" the surface results in inferior cleaning. The resulting local areas of contaminants may significantly reduce yield, overload metrology systems, and create problems in devices produced on the wafer.

In view of the foregoing, it should be appreciated that it would be desirable to provide an improved apparatus and method for rinsing and drying a hydrophobic surface such as a hydrophobic surface of a semiconductor wafer.

SUMMARY OF THE INVENTION

According to an aspect of the invention there is provided a method and apparatus for rinsing and spin-drying a workpiece such as a hydrophobic semiconductor wafer. A minimum linear surface-drying speed above which complete drying occurs is established. A maximum linear surface-drying speed above which residual contaminants dry on the wafer surface is then established. The region between the minimum and maximum linear surface-drying speeds represents a safe zone, and the workpiece is rotated in accordance with a spin-rate gradient that maintains linear speed within the safe zone as radial distance varies.

BRIEF DESCRIPTION OF THE DRAWINGS

The following drawings are illustrative of particular embodiments of the invention and therefore do not limit the scope of the invention, but are presented to assist in providing a proper understanding. The drawings are not to scale (unless so stated) and are intended for use in conjunction with the explanations in the following detailed description. The present invention will hereinafter be described in conjunction with the appended drawings, wherein like numerals denote like elements, and.

DETAILED DESCRIPTION OF EXEMPLARY EMBODIMENTS

The following description is exemplary in nature and is not intended to limit the scope, applicability, or configuration of the invention in any way. Rather, the following description provides a convenient illustration for implementing exemplary embodiments of the invention. Various changes to the described embodiments may be made in the function and arrangement of the elements described herein without departing from the scope of the invention.

Figure 1:
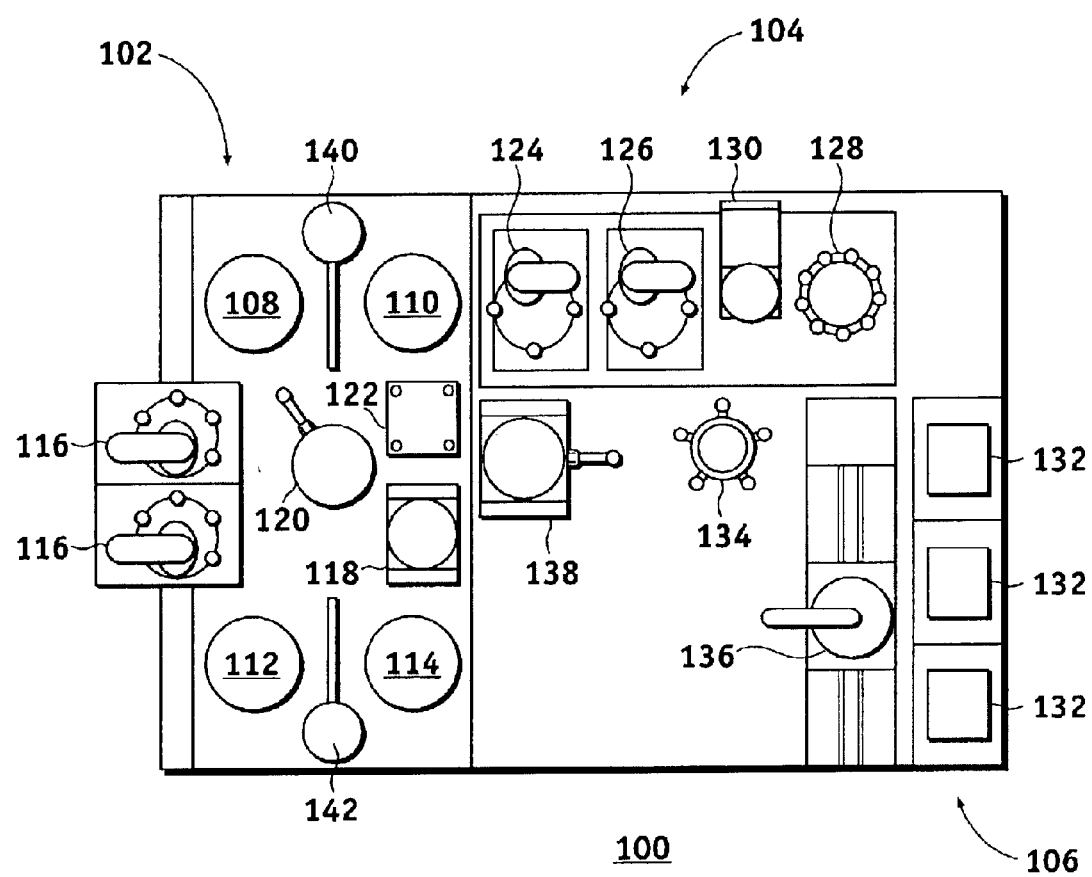
FIG. 1 is a top cutaway view of a wafer processing system capable of incorporating and performing the inventive apparatus and method for cleaning an drying hydrophobic semiconductor wafers.

FIG. 1 illustrates a top cutaway view of the polishing apparatus 100 for processing semiconductor wafers. For example, apparatus 100 is suitable for electrochemically depositing or planarizing conductive material on or from the surface of a workpiece in accordance with the present invention. Apparatus 100 includes a multi-station polishing system 102, a clean system 104, and a wafer load/unload station 106. In addition, apparatus 100 includes a cover (not shown) that surrounds apparatus 100 to isolate apparatus 100 from the surrounding environment. Machine 100 may be a Momentum machine available from SpeedFam-IPEC Corporation of Chandler, Ariz. or may be any machine capable of processing semiconductor wafers.

Although the present invention relates to the cleaning, rinsing, and drying of a variety of workpieces such as magnetic disks, optical disks, and the like, the invention is conveniently described below in connection with rinsing and drying the surface of a wafer. In the context of the present invention, the term "wafer" shall mean semiconductor substrates, which may include layers of insulating, semiconductor, and conducting layers or features formed thereon and used to manufacture microelectronic devices.

Exemplary polishing station 102 includes four polishing stations, 108, 110, 112, and 114, that each operate independently; a buff station 116; a stage 118; a robot 120; and optionally, a metrology station 122. Polishing stations 108–114 may be configured as desired to perform specific functions such as electrochemical planarization, chemical mechanical polishing, and the like.

Polishing system 102 also includes polishing surface conditioners 140 and 142. The configuration of conditioners 140 and 142 generally depend on the type of polishing surface to be conditioned. For example, when the polishing surface comprises a polyurethane polishing pad, conditioners 140 and 142 may include a rigid substrate coated with diamond material. Various other surface conditioners may also be used in accordance with the present invention.

Clean system 104 is generally configured to remove debris such as slurry residue and material from the wafer surface. In accordance with the illustrated embodiment, system 104 includes clean stations 124 and 126, a spin rinse dryer (SRD) 128 and a robot 130 configured to transport the wafer between clean stations 124 and 126 and spin rinse dryer 128. Alternatively, clean station 104 may be separate from the remainder of the apparatus.

Load station 106 is configured to receive dry wafers for processing, but the wafers may remain in a wet (e.g., deionized water) environment until the wafers are transferred to the clean station. In operation, cassettes 132, including one or more wafers, are loaded onto apparatus 100 at station 106. The wafers are then individually transported to a stage 134 using a dry robot 136. A wet robot 138 retrieves a wafer at stage 132 and transports the wafer to metrology station 122 for film characterization or to stage 118 within polishing system 102. Robot 120 picks up the wafer from metrology station 122 or stage 118 and transports the wafer to one of polishing stations 108–114 for electrochemical deposition or planarization. After a desired amount of material has been deposited or removed, the wafer may be transported to another polishing station.

After conductive material has been either deposited or removed from the wafer surface, the wafer is transferred to buff station 116 to further polish the surface of the wafer. After the polishing and/or buff process, the wafer is transferred to stage 118 which is configured to maintain one or more wafers in a wet (e.g. deionized water) environment.

After the wafer is placed in stage 118, robot 138 picks up the wafer and transports it to clean system 104. In particular, robot 138 transports the wafer to robot 130, which in turn places the wafer in one of the clean stations 124 or 126. The wafer is cleaned using one or more stations 124 and 126 and then is transported to spin rinse dryer 128 to rinse and dry the wafer prior to transporting it to load/unload station 106 using robot 136.

Figure 2:
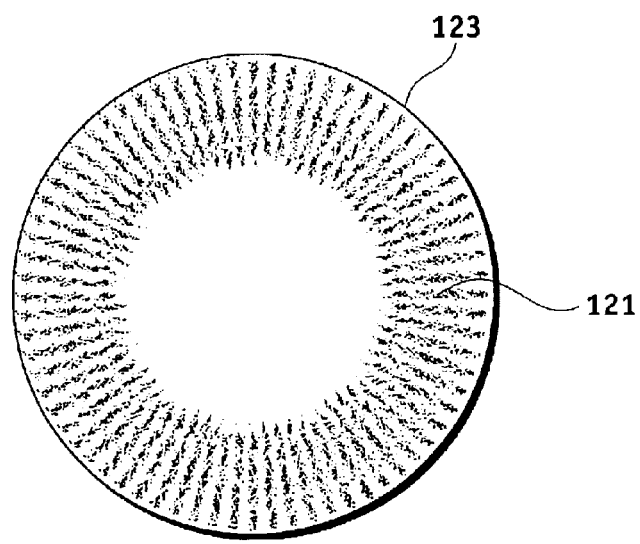
FIG. 2 is a top view of a semiconductor wafer having a hydrophobic surface and the streak marks representing surface contaminants caused by conventional rinsing and drying techniques.
Figure 5:
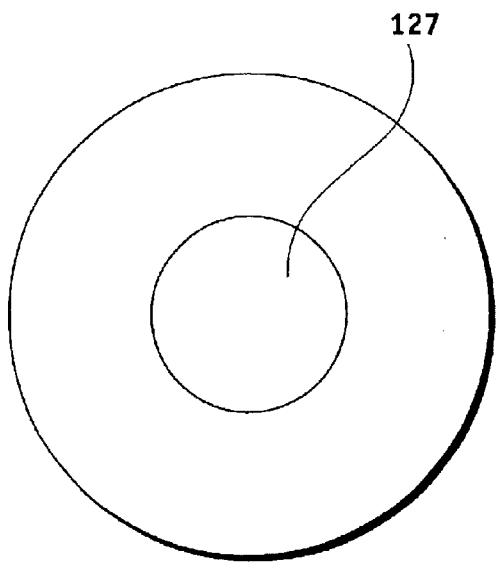
FIG. 5 is a top view of a semiconductor wafer having a hydrophobic surface after undergoing a spin-dry process at low speed.
Figure 6:
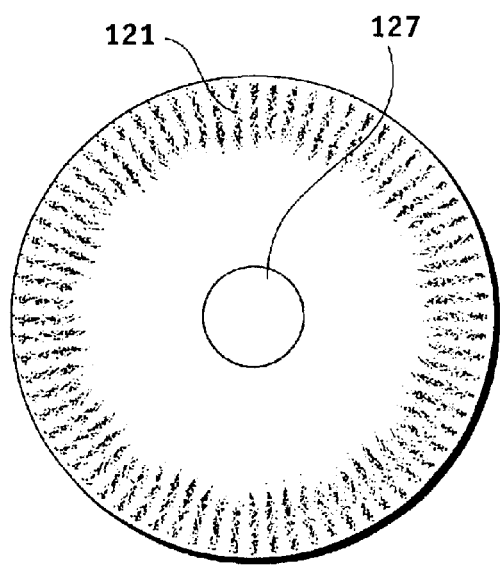
FIG. 6 is a top view of a semiconductor wafer having a hydrophobic surface after undergoing a spin-dry process at intermediate speed.
Figure 3:
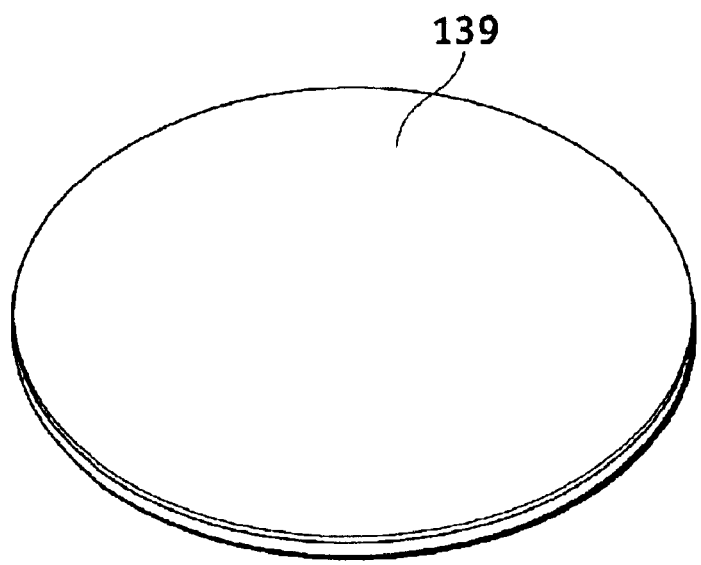
FIG. 3 is a top view of a semiconductor wafer having a wet hydrophilic surface.
Figure 4:
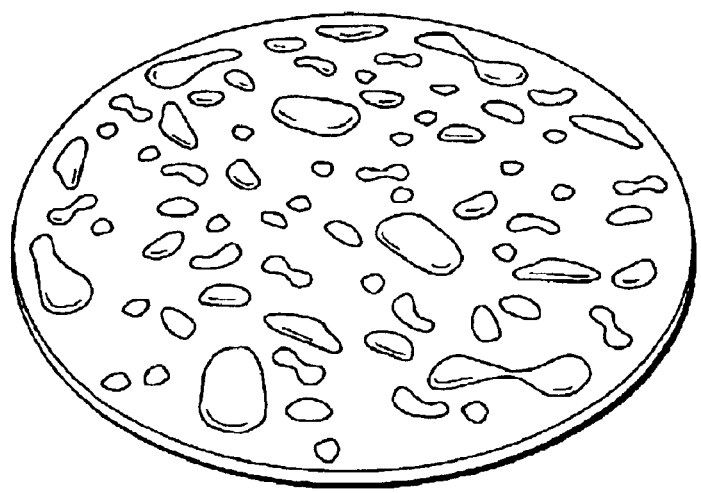
FIG. 4 is a top view of a semiconductor wafer having a hydrophobic surface which repels wafer causing beading.

As stated previously, it is known that rinsing and drying hydrophobic semiconductor wafers using conventional techniques results in the above described streaking 121 as is shown on wafer 123 in FIG. 2. This is due to the fact that a liquid such as deionized water wets a hydrophilic surface as is shown at 139 in FIG. 3, but beads on a hydrophobic surface as is shown in FIG. 4. It has been found that if a hydrophobic wafer is rotated in SRD 128 at low rpm, no streaking results but there is incomplete drying in a radial region 127 near the center of the wafer. This occurs because the linear velocity and resulting centrifugal force exerted on the beads of liquid increases with increasing distance from the center of the wafer where the linear velocity is theoretically zero (see FIG. 5). If the speed of rotation is increased, the center undried 127 area will become smaller than it was at lower speed, and some radial streaking 121 may occur near the wafer's edge in an area which has dried as is shown in FIG. 6. At high speed (i.e. high rpm) the wafer would be dry and streaked as is shown in FIG. 2.

A study of the above described streaking phenomenon has led to the conclusion that for a given hydrophobic material surface, there is a minimum linear velocity that must be achieved for drying to occur, and that this minimum linear velocity is independent of radius. For example, in the case of a carbon doped oxide (CDO) wafer, drying occurs at a minimum linear drying speed (MLDS) of approximately 1.5 meters per second (m/s). At a rotational speed of approximately 500 rpm, this minimum linear speed is reached at approximately 30 millimeters (mm) from the center of the wafer (minimum drying distance-MDD). Linear speeds at distances greater than the minimum drying distance will exceed the minimum linear speed. This is shown graphically in FIG. 6 wherein the horizontal axis represents radial position from the center of the spinning wafer, the vertical axis represents the linear velocity of a point on the wafer at a given radial position, and line 150 represents the relationship between radial position and linear velocity at a rotational speed of 500 rpm. Line 152 represents the minimal linear speed below which only poor drying occurs. Lines 154 and 156 represent the relationship between radial position and linear velocity at 1,000 rpm and 3,000 rpm respectively.

Figure 7:
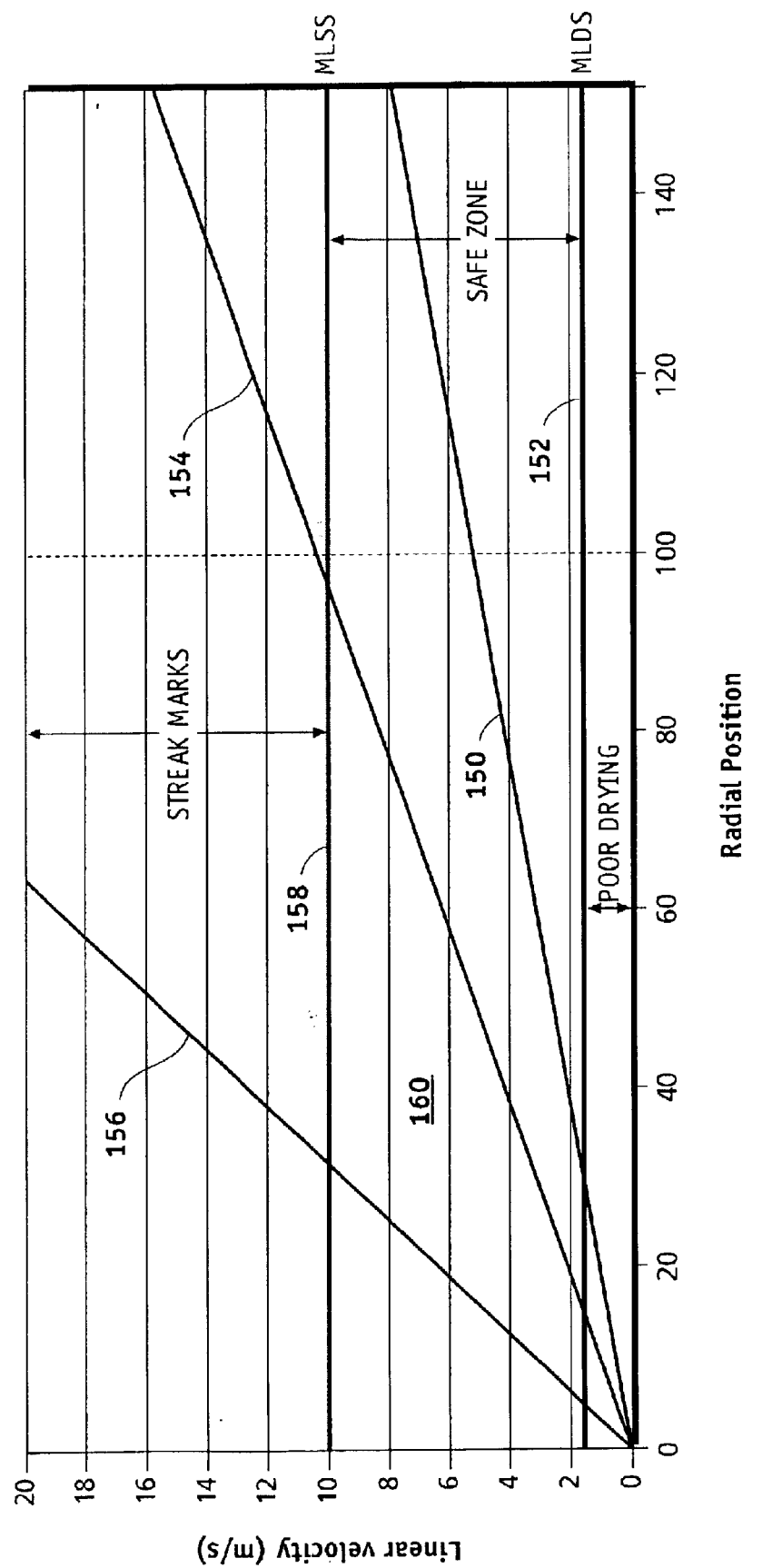
FIG. 7 is a graphical representation of the relationship between radial position on a wafer, rotational speed (rpm), and linear velocity as a function of radial position.

In a similar manner, the linear velocity at which streaking begins to occur can be determined using empirical data. For the example given above, streaking begins to occur at a minimum linear streaking speed (MLSS) of approximately 10 m/s as is represented by line 158 in FIG. 7. Thus, the region between line 152 (MLDS) and line 158 (MLSS) represents a safe zone 160 within which suitable drying without streaking may be achieved at a given radial distance from the center of the wafer at various rotational speeds. For example, at 1000 rpm, the safe zone 160 extends from approximately 12 mm to approximately 95 mm. At 3000 rpm, safe zone 110 extends from approximately 5 mm to approximately 35 mm.

Figure 8:
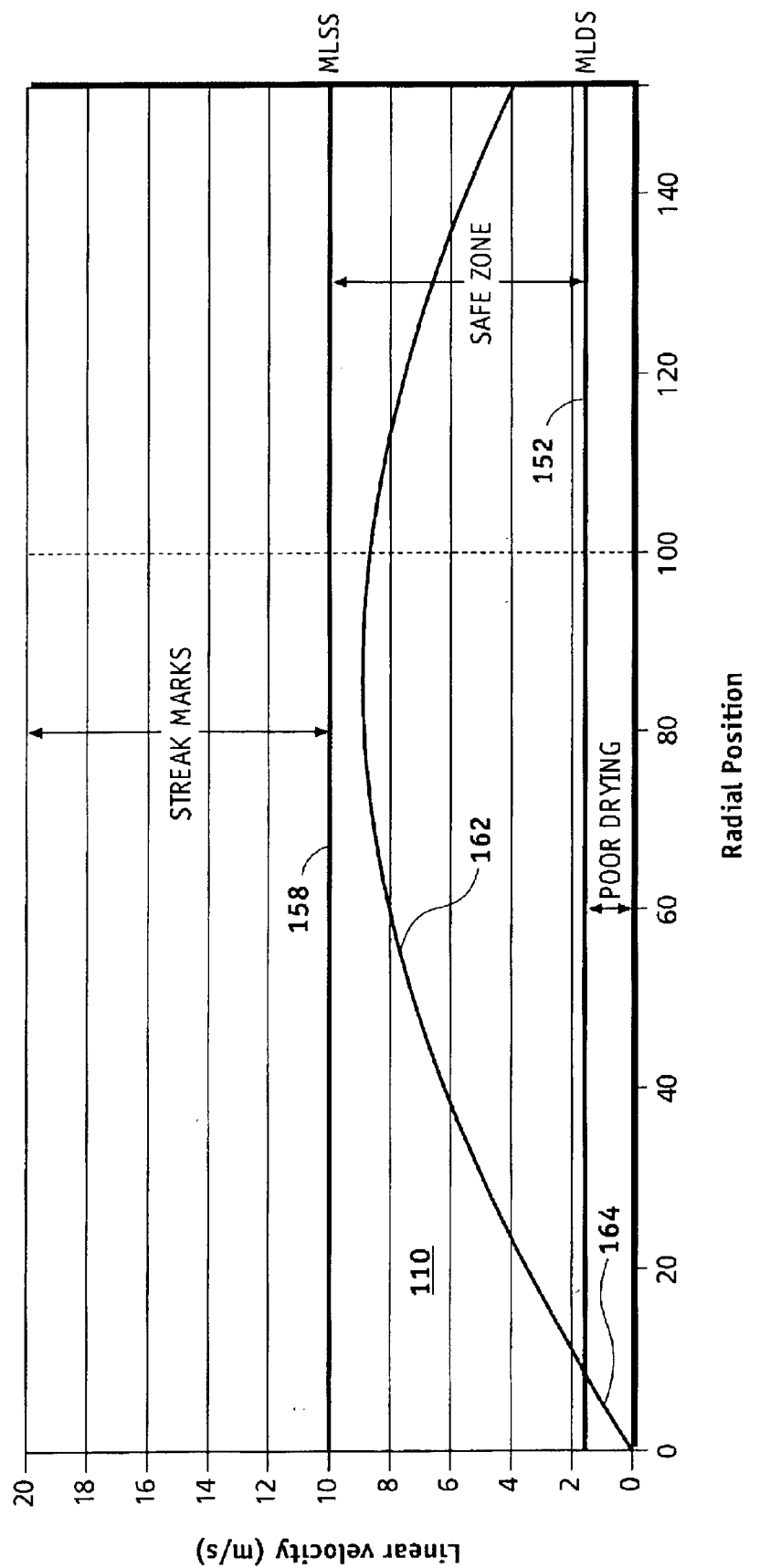
FIG. 8 is a graphical representation illustration of a variable rotational speed function in accordance with the teachings of the present invention.

FIG. 8 is a graphical representation illustrating how a variable rotational wafer speed gradient 162 can be designed to remain substantially within safe zone 160. As can be seen, linear velocity increases with increasing distance from the center of the wafer until a radial distance of approximately 70 mm is reached after which the velocity begins to decrease. Thus, except for a small region 164 near the center of the wafer, suitable drying without streaking is achievable. Since the linear speed at the wafer's center is theoretically zero, there will be a small region near the center of the wafer that does not dry properly. This region can be made smaller by spin-drying at very high rpm as will be discussed below. While a specific variation in linear velocity as a function of radial position has been shown in FIG. 8, it should be clear that the linear velocity as a function of radial position of the wafer can be altered in a wide variety of ways and still remain within safe zone 160.

Figure 9:
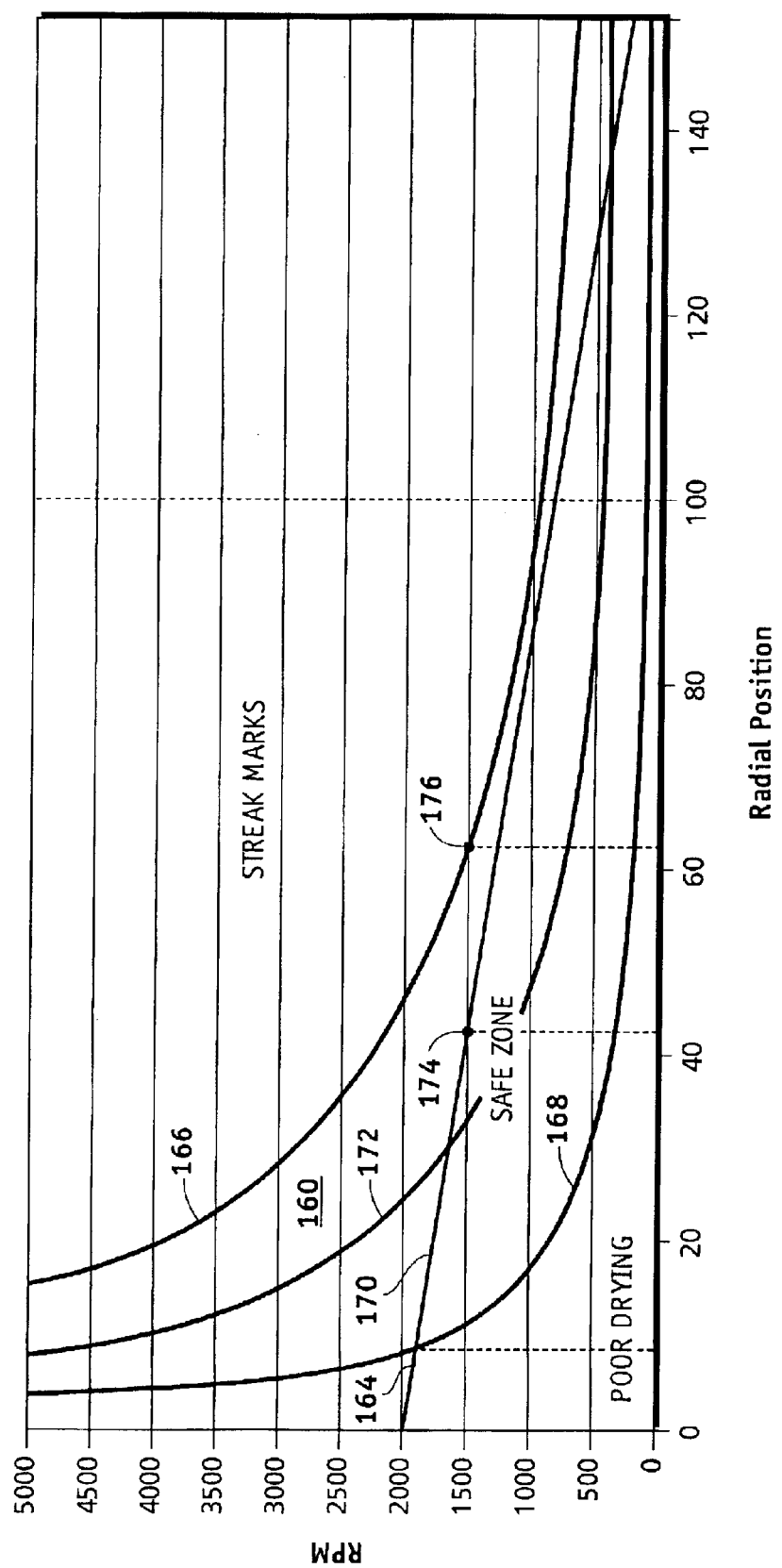
FIG. 9 is a graphical representation illustrating the drying safe zone or window shown in FIG. 7 and FIG. 8 as a function of rotation speed (rpm)

FIG. 9 is a graphical representation wherein the minimum linear streaking speed (MLSS) and the minimum speed drying (MLDS) have been converted to a minimum rotational streaking speed function 166 and minimum rotational drying speed function 168 in accordance with the relationship $$V_R = \frac{V_L}{2\pi R} \cdot (60,000)$$

where $V_L$=linear velocity (m/s)
$V_R$=RPM
R=radial position (mm from center)
defining safe zone 160 therebetween. As can be seen, linear line 170 and non-linear line 172 represent only two of many possible rotational speed gradients as a function of radial position from the center of the spinning wafer which results in a spin-drying process which remains substantially in the safe zone 160. In the case of decreasing linear variation 170, there is shown the above referred to discontinuity 164 appearing at or near the center of the wafer. It should also be apparent from FIG. 9 that the region of poor drying near the center of the wafer decreases with increasing rpm.

It should now be clear that to achieve proper drying near the center of the wafer; the wafer should spin at a relatively high rpm, while a lower rpm should be employed near the wafer's edge to avoid streaking. In choosing a rotational speed gradient, care should be exercised to insure that a high rotational speed utilized to optimize drying in the wafer's central region does not inadvertently cause drying and possible streaking near the wafer's edge. For example, referring again to FIG. 9, if a rotational speed gradient of the type represented by line 170 were employed, and the wafer was spinning at approximately 1500 rpm (i.e. within the safe zone), streaking could occur on the wafer beyond approximately 63 mm from the wafer's center (i.e. point 176). This potential problem can be avoided by dispensing water from a nozzle onto the spinning wafer, first at the wafer's center and then moving the nozzle radially outward toward the wafer's edge as the rinsing/drying processes progresses. In this manner, as the inner regions of the wafer are dried, the outer regions are maintained in a wet condition and thus streaking is avoided.

Figure 10:
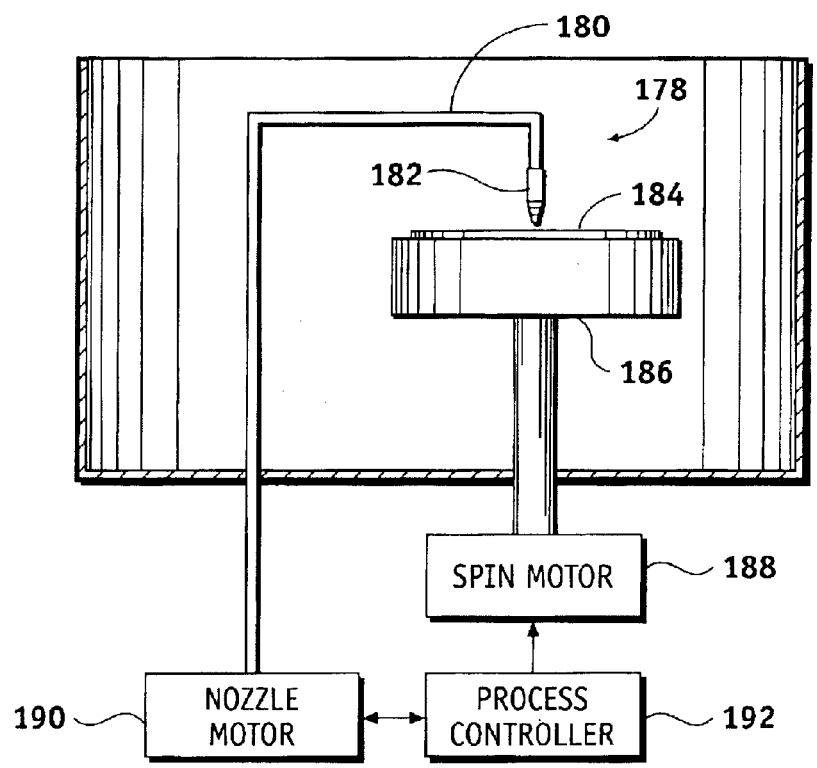
FIG. 10 is a side view of an apparatus suitable for carrying out the inventive rinsing/drying process.
Figure 11:
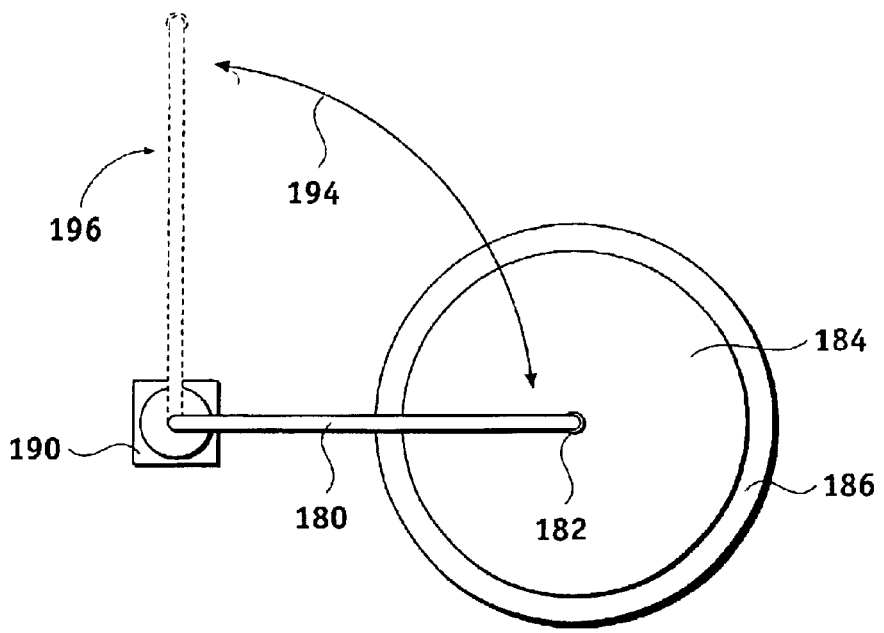
FIG. 11 is a top plan view of the apparatus shown in FIG. 10.

An apparatus for carrying out the inventive rinsing/drying technique is shown in FIGS. 10 and 11. A SRD 178 includes a spin chuck 186 for supporting a hydrophobic workpiece 184 such as a semiconductor wafer. Spin chuck is coupled to motor 188 configured to rotate spin chuck 186 about a vertical axis. A nozzle 182 is positioned to deposit a rinsing liquid (e.g. deionized water) onto the surface of wafer 184. It should be clear that other liquids (e.g. isopropyl alcohol, etc.) may be dispensed onto wafer 184 via nozzle 182. Nozzle 182 receives fluid through conduit 180 from a source of such fluid (not shown). A nozzle motor 190 is coupled to nozzle 182 to rotate nozzle 182 and conduit 180 so as to dispense fluid onto the surface of wafer 184 starting at its center and rotating towards its edge as is shown by arrow 194 and the dotted lines at 196. The speed of spin motor 188 and the roatation imparted to nozzle 182 by nozzle motor 190 is controlled by process controller 192 which contains software adapted to rotate spin chuck 186 at rotational speeds within the above described safe zone and to coordinate the movement of nozzle 182 as it scans across wafer 184 from center to edge.

Thus, there has been provided a method and apparatus for rinsing and spin-drying a hydrophobic material such as a semiconductor wafer which improves drying of the wafer while at the same time reduces the deposition of residual contamination on the dried surface of the wafer. This is accomplished by first establishing a safe zone between the minimum rotational speed above which drying proceeds satisfactorily and the maximum rotational speed above which contaminants dry on the wafer. A spin-rate profile can then be adapted such that the rinse/dry process proceeds within the safe zone.

In the foregoing specification, the invention has been described with reference to specific embodiments. However, it may be appreciated that various modifications and changes can be made without departing from the scope of the invention as set forth in the appended claims. Accordingly, the specification and figures are to be regarded as illustrative rather than as restrictive, and all such modifications are intended to be included within the scope of the present invention.

What is claimed is:

1. A method for spin-drying a workpiece, comprising:
   establishing a minimum linear drying speed, at or above which a workpiece surface area will become dried during a predetermined spin-drying process; establishing a maximum linear drying speed, at or above which contaminants dry on a workpiece surface area, the region between the minimum linear drying speed and the maximum linear drying speed representing a safe zone; and spinning the workpiece in accordance with a spin rate gradient that causes substantially every point along the workpiece radius to have a linear speed within the safe zone at some time during the predetermined spin-drying process.

2. A method according to claim 1 wherein the workpiece is hydrophobic.

3. A method according to claim 1 wherein the workpiece is a hydrophobic semiconductor wafer.

4. A method according to claim 3, wherein the difference, as a function of radial distance, between the minimum and maximum linear drying speeds defines a zone in which the wafer can be dried without significant formation of contaminant residue on the dried wafer.

5. A method according to claim 4, further comprising dispensing a liquid on said hydrophobic semiconductor wafer starting at its center and moving toward an edge of the hydrophobic semiconductor wafer.

6. A method according to claim 5 wherein said liquid is deionized water.

7. A meted according to claim 6 wherein the minimum linear drying speed is approximately 1.5 mm/sec.

8. A method according to claim 6 wherein the maximum linear drying speed is approximately 10 mm/sec.

9. A method for spin-drying a hydrophobic semiconductor wafer, comprising:

establishing a range of linear speed within which said wafer will dry without significant contaminant deposition during a predetermined spin-driving process; and spinning the wafer in accordance with a spin-rate gradient that causes substantially every point along the workpiece radius to have a linear speed within the range at some time during the predetermined spin-drying process.

10. A method according to claim 9 further comprising dispensing a liquid on the wafer starting at its center and moving toward an edge of the wafer.

11. A method according to claim 10 wherein the liquid is deionized water.

12. A method of spin-drying a workpiece, comprising:

determining a minimum spin-rate as a function of distance from the center of the workpiece;

determining a maximum spin-rate as a function of distance from the center of the workpiece, the region between the minimum spin-rate and the maximum spin rate representing a safe zone;

spinning the workpiece in accordance with a spin-rate gradient that causes substantially every point along the workpiece radius to have a spin-rate within the safe zone at some time while spinning; and dispensing a liquid on the workpiece during the spinning step, starting at the workpiece center and moving toward an edge of the workpiece.

13. A method according to claim 12 wherein said workpiece is a hydrophobic semiconductor wafer.

14. A method according to claim 13 wherein the minimum spin-rate varies with radial distance from the center of the wafer so as to achieve a linear speed above a minimum linear speed that supports substantially complete drying.

15. A method according to claim 14 wherein the maximum spin-rate varies with radial distance from the center of the wafer so as to achieve a linear speed below a linear speed at which a residue of contaminants begins to form on the wafer.

16. A method according to claim 15 wherein the liquid is deionized water.

17. A method according to claim 15 wherein the liquid is alcohol.

18. A method according to claim 16 wherein the minimum spin rate corresponds to a linear speed of approximately 1.5 mm/sec.

19. A method according to claim 18 wherein the maximum spin-rate corresponds to a linear speed of approximately 10 mm/sec.

20. A spin-rinse drying apparatus for cleaning and drying a workpiece, comprising:

a support for supporting said workpiece;

a motor coupled to said support for rotating said workpiece; and a controller coupled to said motor and configured to vary the speed of rotation of said workpiece through a predetermined spin-drying process, and to thereby cause substantially every point along the workpiece radius to have a linear speed between a first predetermined value and a second predetermined value at some time during the predetermined spin-drying process.

21. An apparatus according to claim 20 wherein said workpiece is a hydrophobic semiconductor wafer.

22. An apparatus according to claim 21 wherein said linear speed is between approximately 1.5–10 mm/sec.

23. An apparatus according to claim 21 wherein said first predetermined value corresponds to a value below which incomplete drying occurs.

24. An apparatus according to claim 23 wherein said second predetermined value corresponds to a value above which drying occurs leaving a residue of contaminants.

25. An apparatus according to claim 24 wherein said first predetermined value is approximately 1.5 mm/sec.

26. An apparatus according to claim 25 wherein said second predetermined value is approximately 10 mm/sec.

27. An apparatus for processing at least one semiconductor wafer, comprising:

at least one wafer processing station at which at least one processing step is performed on said at least one semiconductor wafer; and a spin-rinse dryer for cleaning and drying said at least one semiconductor wafer, said spin-rinse dryer comprising;

a support for supporting said at least one semiconductor wafer, a motor coupled to said support for rotating said support and said at least one semiconductor wafer; and a controller coupled to said motor and configured to vary the speed of rotation of each of said at least one semiconductor wafer through a predetermined spin-drying process, and to thereby cause substantially every point along each semiconductor wafer radius to have a linear speed substantially between a first predetermined speed and a second predetermined speed at some time during the predetermined spin-drying process.

28. An apparatus according to claim 27 wherein said wafer is hydrophobic.

* * * * *

UNITED STATES PATENT AND TRADEMARK OFFICE
CERTIFICATE OF CORRECTION

PATENT NO.   : 6,892,472 B2
DATED        : May 17, 2005
INVENTOR(S)  : Justin M. Quarantello It is certified that error appears in the above-identified patent and that said Letters Patent is hereby corrected as shown below:

Column 7,
Line 27, delete "meted" and add -- method --.
Line 35, delete "spin-driving" and add -- spin-drying --.

Signed and Sealed this

Nineteenth Day of July, 2005

JON W. DUDAS
*Director of the United States Patent and Trademark Office*